United States Patent [19]

Yamaguchi et al.

[11] Patent Number: 5,406,026
[45] Date of Patent: Apr. 11, 1995

[54] FRAME STRUCTURE FOR A COMMUNICATION SYSTEM

[75] Inventors: Akiyoshi Yamaguchi; Yuji Hasegawa; Manabu Miyamoto; Minoru Suzuki; Koichi Abe; Hideki Sonobe; Sadayuki Tetsu, all of Kawasaki, Japan

[73] Assignee: Fujitsu Limited, Kawasaki, Japan

[21] Appl. No.: 232,457

[22] Filed: Apr. 22, 1994

Related U.S. Application Data

[63] Continuation of Ser. No. 935,392, Aug. 26, 1992, abandoned.

[30] Foreign Application Priority Data

Aug. 31, 1991 [JP] Japan .................... 3-220785
Jan. 20, 1992 [JP] Japan .................... 4-007808

[51] Int. Cl.⁶ .................................... H05K 9/00
[52] U.S. Cl. ............................. 174/35 R; 361/818
[58] Field of Search ................... 174/35 R, 35 MS; 361/816–818; 343/841; 358/254–255; 257/659–660, 704

[56] References Cited

U.S. PATENT DOCUMENTS

| | | | |
|---|---|---|---|
| 2,333,532 | 11/1943 | Frakes et al. | 175/183 |
| 2,354,556 | 7/1944 | Stahl | 174/35 MS |
| 3,247,574 | 4/1966 | Wirtz | 174/35 MS |
| 3,334,175 | 8/1967 | Vincent | 174/35 R |
| 3,334,597 | 8/1967 | Ruskin et al. | |
| 4,608,453 | 8/1986 | Freeman | 174/35 MS |
| 4,831,210 | 5/1989 | Larson et al. | 174/35 MS |
| 5,063,273 | 11/1991 | Bloks | 174/35 R |
| 5,171,936 | 12/1992 | Suzuki et al. | 174/35 MS |

FOREIGN PATENT DOCUMENTS

| | | |
|---|---|---|
| 238220 | 9/1987 | European Pat. Off. |
| 0482460 | 4/1992 | European Pat. Off. |
| 53-129832 | 11/1978 | Japan |

*Primary Examiner*—Bot Ledynh
*Attorney, Agent, or Firm*—Staas & Halsey

[57] ABSTRACT

A frame structure for a communication system includes a framework for accommodating a communication system and a cover member mounted on the framework. The cover member has an insulating material layer provided between a semiconducting material layer and a conducting material layer, and is mounted so that the conducting material layer will face inside. The semiconducting material layer and the conducting material layer are electrically connected to each other.

5 Claims, 15 Drawing Sheets

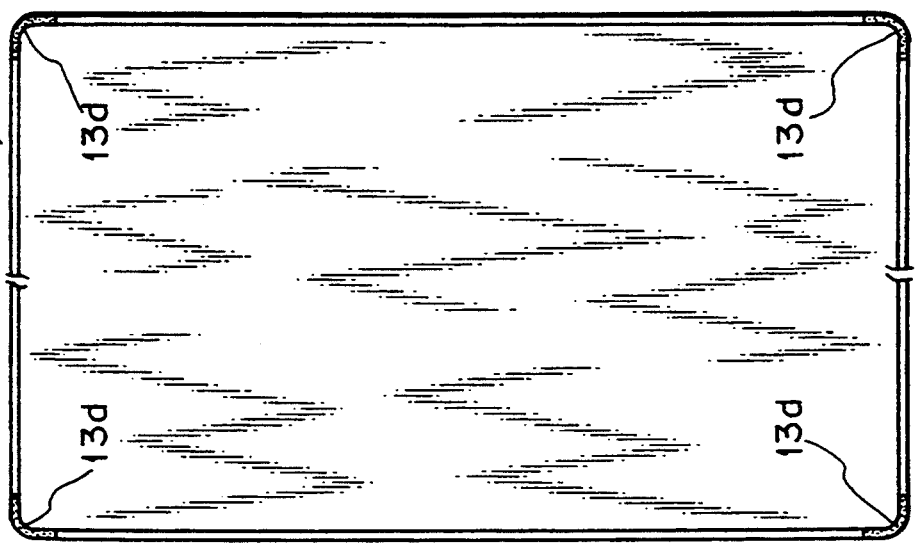
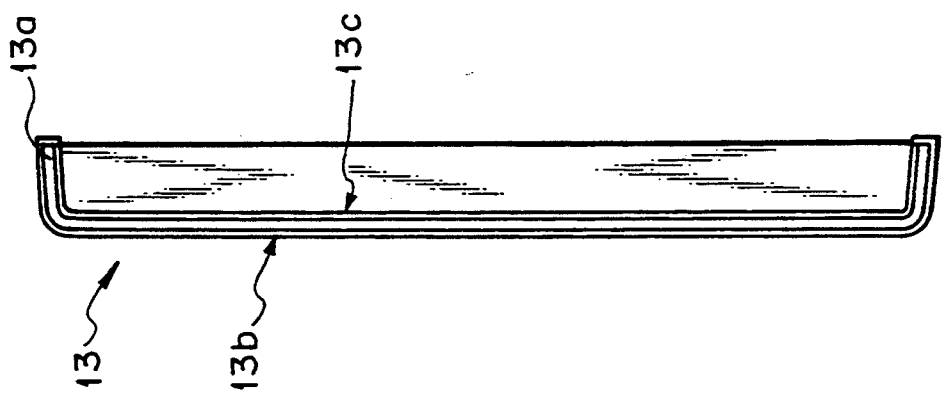

$L > \ell$

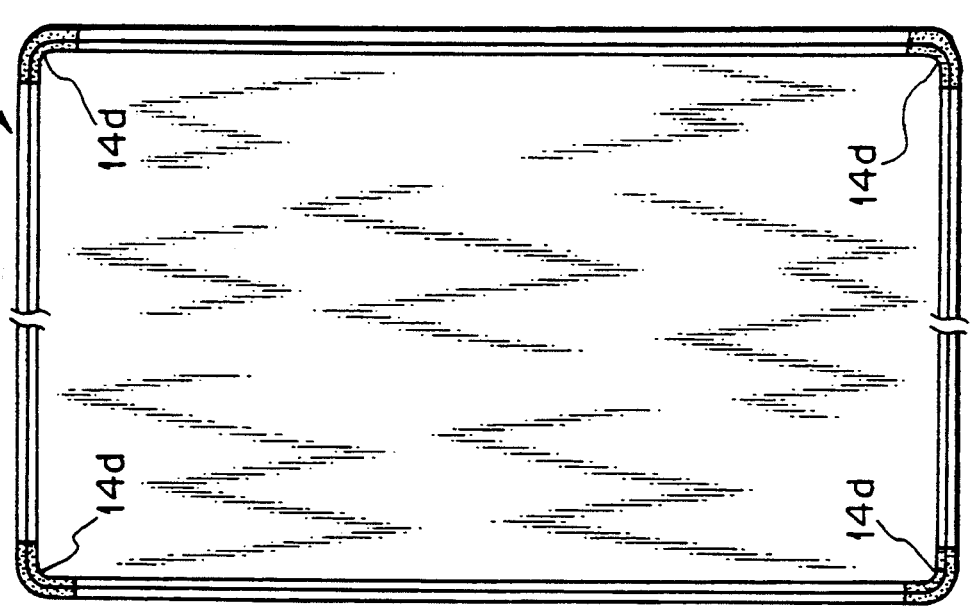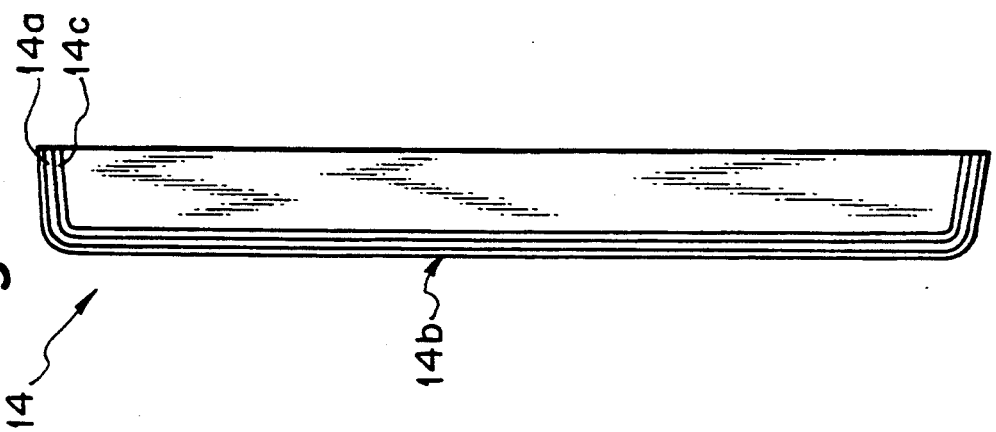

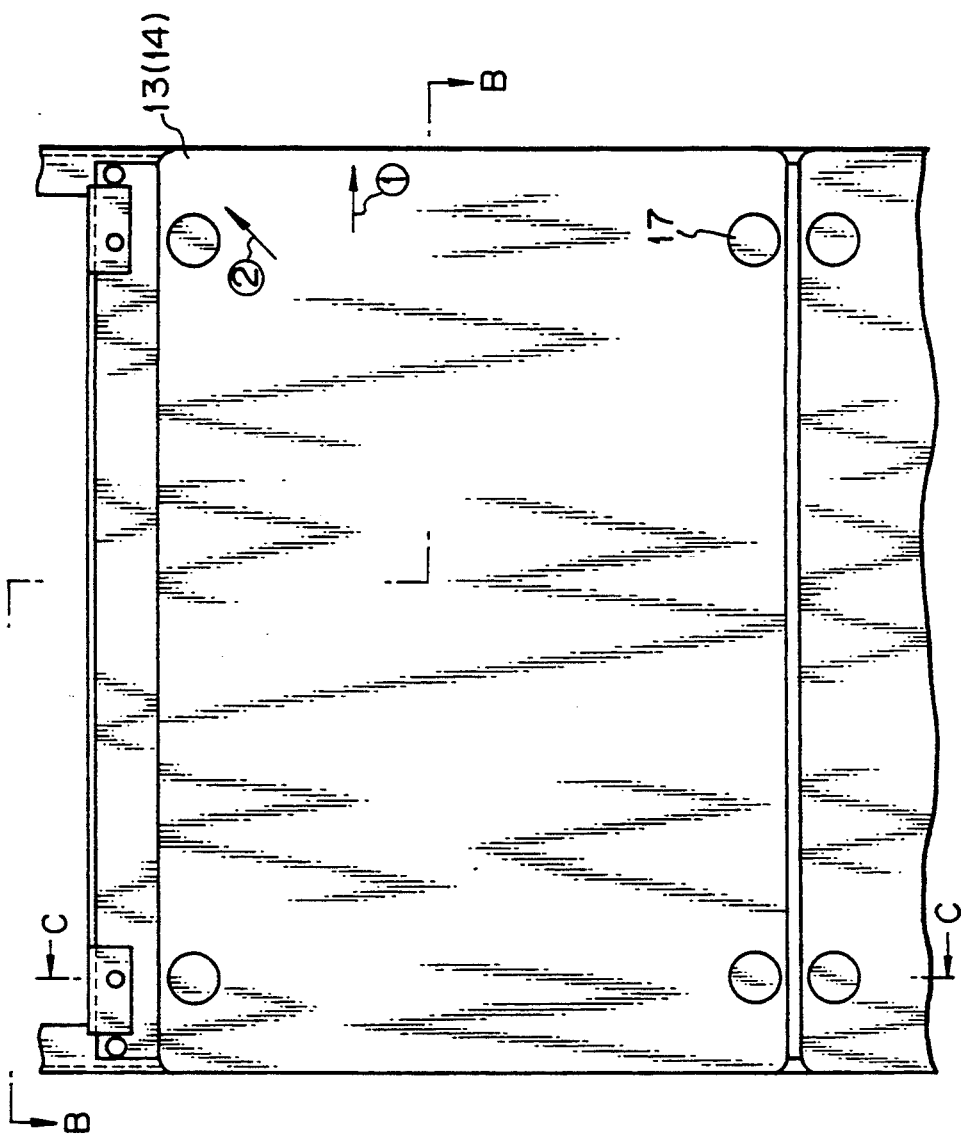

FRAME STRUCTURE FOR A COMMUNICATION SYSTEM

This application is a continuation of application Ser. No. 07/935,392, filed Aug. 26, 1992, now abandoned.

BACKGROUND OF THE INVENTION

1. Field of the Invention

The present invention relates to a frame structure for a communication system, or more particularly, to a frame structure that withstands electromagnetic interference (EMI) or electrostatic discharge (ESD).

2. Description of the Related Art

A communication system is conventionally mounted or stored in a device frame such as a metallic housing shaped like a box and made by mounting a metallic cover on a framework, and wherein a power unit, a transmitter, a receiver, and other multiple electronic units are placed on shelves.

The whole communication system is covered with metal, and therefore, electromagnetic waves radiating from various units in the device frame will not leak out and the external electromagnetic waves will not enter the device frame, thereby minimizing the occurrence of a fault.

When a person touches a device frame such as a metallic housing, static electricity develops to induce a spark discharge. Then, the discharge voltage rapidly falls to 0 volts. As a result, a high-speed surface current (heavy current composed of short pulses having sharp leading edges) flows in the metallic housing, generates a localized magnetic field on the orthogonal axis, and then dies out.

Therefore, the magnetic field develops a wide-band electromagnetic wave with frequencies ranging from several tens of MHz to several GHz. Various electronic units in the device frame are affected. More particularly, (1) with the inflow of a heavy current that is composed of short pulses having sharp leading edges, the wiring of digital equipment is subject to induction noise (induction interference). A heavy current resulting from a discharge generates an electromagnetic field, which involves the wiring (electromagnetic induction), resulting in a noise voltage, and fluctuation of the signal level, thereby causing a malfunction. (2) The potentials of a frame ground (FG) line and a signal ground (SG) line are disturbed (fluctuated). The voltage of the SG line that is designed to be 0 volts differs greatly from circuit to circuit, thereby leading directly to a logical inversion and resulting in a malfunction.

In an effort to prevent a malfunction due to an electrostatic discharge through the human body, another large metallic frame (referred to as an accommodation frame) has been prepared differently from the device frame and the device frame has been stored in the accommodation frame in the past. This double structure allows an electrostatic discharge to occur at a place separated by more than a given distance from the device frame and thus prevents an electromagnetic wave, developed by the electrostatic discharge, from invading the device frame. The accommodation frame and device frame are grounded via independent earthing wires, so that a heavy current developed by an electrostatic discharge will not flow in the device frame.

The influence of an electrostatic discharge is inversely proportional to the square of the distance from the electrostatic discharge. A larger accommodation frame results in a larger distance. Consequently, the influence of an electrostatic discharge is reduced. However, the whole apparatus becomes larger, and thus, the operability of the apparatus deteriorates, and the price of the apparatus increases. Thus, the product value of the apparatus is degraded. So far as a communication system is concerned, diverse layouts are conceivable; that is, a transverse layout in which multiple units are arranged in a row, and a longitudinal layout in which multiple units are arranged back to back. To cope with the diverse layouts, different accommodation frames must be constructed in association with the layouts poor flexibility ensues.

SUMMARY OF THE INVENTION

The primary object of the present invention is, therefore, to provide a frame structure for a communication system capable of preventing the occurrence of a fault derived from electromagnetic interference or electrostatic discharge and which results in a simple and compact communication system.

To achieve the above object, according to the present invention, there is provided a frame structure for a communication system comprising a framework for accommodating a communication system, and at least one cover member having an insulating material layer provided between a semiconducting material layer and a conducting material layer, and mounted on said framework so that said conducting material layer will face inside, wherein said semiconducting material layer and said conducting material layer are electrically connected to each other at at least one point.

In other words, covers each having an insulating material layer placed between a semiconducting material layer and a conducting material layer and having the semiconducting material layer and conducting material layer electrically coupled to each other at at least one point are mounted on a framework for holding a communication system in such a manner that the conducting material layers will face inside.

The cover members are formed with bases that are made of an insulating resin material. One surface or face of each base is coated with carbon and the back or other faces of each base is coated with a metallic conducting material or a conducting metallic film.

The cover members may be formed with bases that are made of a conducting metallic material. The surfaces of the bases are coated with insulating resin film and with carbon.

When through holes are bored in the cover members, the inner surfaces of the through holes are coated with carbon.

The cover members include inner covers and outer covers. The inner covers are made of a conducting metallic material. The outer covers are produced by coating the entire surfaces of the bases that are made of an insulating resin material with carbon. The outer covers are mounted on the inner covers from the outside.

A "conducting material" mentioned in this specification represents a material having a very small electric resistance. An "insulating material" represents a material having a very large electric resistance. A "semiconducting material" represents a material whose electric resistance is intermediate between the electric resistances of the conducting and insulating materials. "Carbon coating" means a coating using a semiconducting material prepared by mixing an insulating material with a conducting material. "Metallic conductive coating" means coating using a conducting material.

According to the present invention, each of the cover members to be mounted on a framework has a sandwich structure in which an insulating material layer is placed between a semiconducting material layer and a conducting material layer. The cover members are mounted on the framework in such a manner that the conducting material layers face inside and the semiconducting material layers face outside.

When an electromagnetic wave is leaking from a frame or invading the frame from outside, the conducting material layer generates a magnetic field oriented in such a direction as to cancel out an eddy current occurring with the incoming magnetic field of the electromagnetic wave. The generated magnetic field electromagnetically isolates the inside of the frame from the outside. Since an insulating material layer and a semiconducting material layer are present outside the conducting material layer, the human body will never touch the conducting material layer, thereby resulting in the heavy current developed by an electrostatic discharge hardly ever flowing in the conducting material layer, and a fault derived from an electrostatic discharge will seldom occur.

The semiconducting material layer is located outside, and therefore, a person may touch the semiconducting material layer. The semiconducting material layer has a higher surface DC electrical resistance than the conducting material layer, and thus suppresses the electrostatic discharge through the body, and even if an electrostatic discharge occurs, a heavy current comparable to that flowing in the conducting metallic material will not flow in the semiconducting material layer, thereby suppressing the development of an electromagnetic wave.

When a high discharge voltage is induced in a semiconducting material layer, the insulating material layer prevents the high-voltage discharge from reaching a conducting material layer and hinders the inflow of a heavy current to the conducting material layer.

The semiconducting material layer and the conducting material layer are electrically coupled to each other at at least one point. Therefore, a current or an electric charge produced during an electrostatic discharge will not proceed to a frame via the conducting material layer, charge the semiconducting material layer, and eventually induce an inverse discharge in a human body.

On the other hand, each of the cover members of the present invention can be made by laminating layers, or in particular, by applying a carbon coating or metallic conductive coating as described previously, or by forming a film, thereby providing thin cover members. Unlike a conventional double frame structure, the frame structure according to the present invention permits the formation of a very compact system.

As described above, when the frame structure according to the present invention is adopted, the size of the system does not increase but the occurrence of a fault derived from electromagnetic interference or an electrostatic discharge is effectively prevented.

These and other objects of the present invention will become apparent from the following detailed description of the preferred embodiment of the invention, taken in connection with the accompanying drawings.

BRIEF DESCRIPTION OF THE DRAWINGS

FIGS. 3(a) and 3(b) are views showing a bonnet cover having a resin base according to the first embodiment of the present invention;

FIGS. 5(a) and 5(b) are views showing a bonnet cover having a metallic base;

FIG. 7 is a front view of a bonnet cover;

DESCRIPTION OF THE PREFERRED EMBODIMENTS

Figure 1:
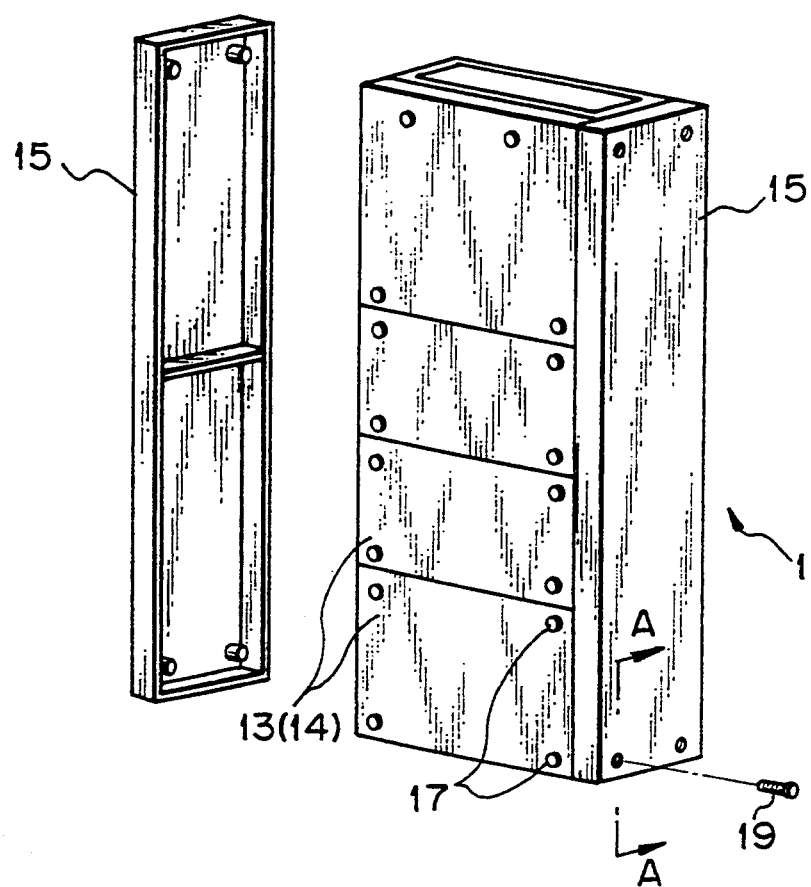
FIG. 1 is an overall perspective view of a frame for a communication system according to a first embodiment of the present invention.
Figure 2:
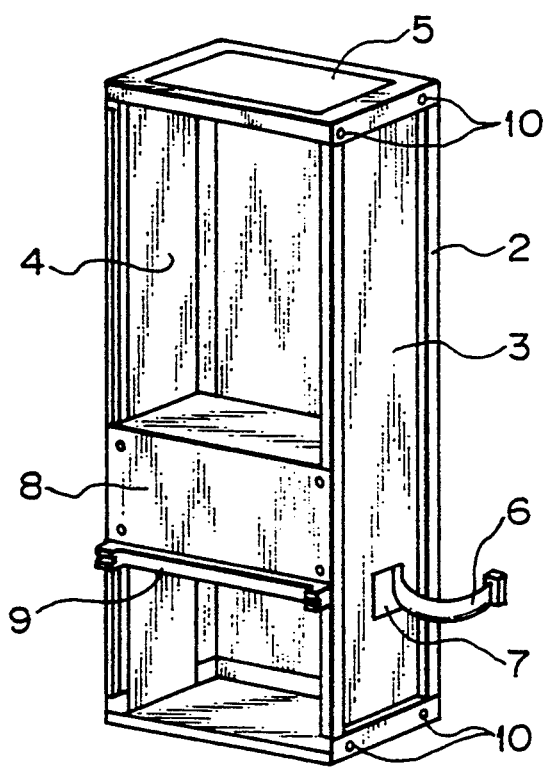
FIG. 2 is a perspective view of a frame with the front and side covers removed according to the first embodiment of the present invention.

FIG. 1 is an overall oblique view of a frame for a communication system according to a first embodiment of the present invention. FIG. 2 is an oblique view of the frame with the front and side covers removed.

In FIGS. 1 and 2, a frame 1 in the first embodiment has a framework 2 made, in principle, of section steel. The sides and back of the framework 2 shaped like a box are covered with metallic plates 3, 4, and 5 (FIG. 2). A square hole 7 for routing a cable 6 and electrically connecting external equipment is bored in the lower part of the side plate 3 of the framework.

In FIG. 2, 8 denotes a shelf accommodating communication equipment. Multiple shelves are mounted in the framework 2 of frame 1 but only one shelf is illustrated.

Multiple bonnet cover mounting brackets 9 (only one bracket is illustrated) are screwed on framework portions corresponding to spaces between shelves, and upper and lower framework portions on the opened front of the framework 2.

Side cover taps 10 are formed in upper and lower framework portions on the sides of the framework 2. The areas around the taps are masked. The taps are formed with bared plated steel plates to conduct electricity.

Multiple bonnet covers 13 (14) are mounted on the front of the framework 2 having the foregoing configuration, and side covers 15 are mounted on the sides of the framework 2. Thus, a frame 1 of this embodiment is structured.

The bases of the bonnet covers 13 are, in principle, formed with plates (13a) that are made of an acrylic denatured high-impact vinyl chloride resin [product name: TakiFlex EVC8600 (transparent): Takiron Co., Ltd.] or other vinyl chloride resin having excellent formability and mechanical characteristics, or of aluminum, stainless steel, plated steel, or other metal such as shown at 14(a) in FIGS. 5 and 6.

When vinyl chloride resin layer 13a is employed as a base, as shown in FIG. 3, the outside surface of the base 13a of each of the bonnet covers 13 is coated with an electrostatic discharge/charge prevention material layer (ESD prevention coating) 13b, and the inside surface of the base 13a is coated with an electromagnetic wave shield material layer (EMI shield coating) 13C. The electrostatic discharge/charge prevention coating material layer 13b should have a surface DC electrical resistance ranging from $10^3$ to $10^4$ ohms/cm. Carbon black is used as the filler. A urethane denatured acrylic resin [for example, a product by the name of Shinto Chemitoron D-4256: Shinto Chemitoron Co., Ltd.] is employed as the binder. The electrostatic discharge/charge prevention coating (13b) is, hereafter, referred to as a carbon coating.

The electromagnetic wave shield coat material layer 13C should have a volume-specific resistance of $10^{-3}$ ohms/cm or less. Nickel or copper is used as the filler. A thermoplastic acrylic resin [for example, a product by the name of Shinto Chemitoron E-3063 or E-3315: Shinto Chemitoron Co., Ltd.] is employed as the binder. The electromagnetic wave shield coating (13C) is, hereafter, referred to as a metallic conductive coating.

Figure 4:
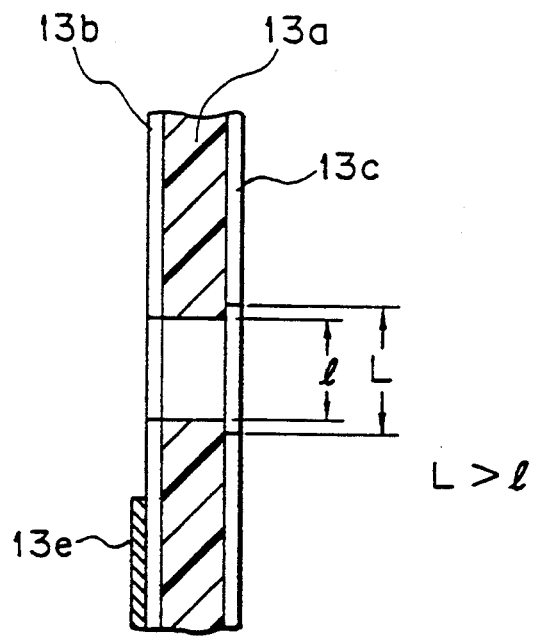
FIG. 4 is a cross-sectional diagram showing the vicinity of a hole on the bonnet cover shown in FIGS. 3(a) and 3(b)
Figure 6:
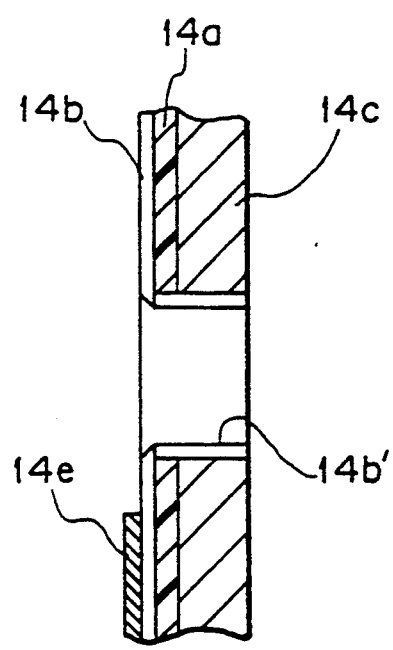
FIG. 6 is a cross-sectional diagram showing the vicinity of a hole on the bonnet cover shown in FIGS. 5(a) and 5(b)

For a refined design, carbon coating is accompanied by normal coating. The normal coating provides a resin insulator. Therefore, as shown in FIGS. 4 and 6 normal coating 13e, 14e should be done to such an extent that it will not impair the design of a frame, or produce a coat of, for example, 10 μm or less in thickness so that a discharge will reach a carbon coat 13b even with a low voltage.

If a resin employed for a base contains a flat-wise (volume resistive) carbon black including no metallic filler, the surfaces of the bases need not be coated with carbon. A resin containing a flat-wise carbon black is fully conductive. Therefore, the ends of the vents need not be processed. A carbon coat 13b and a metallic conductive coat 13c are coupled to each other by applying a carbon coating 13d to at least one point e.g. four corners of the bonnet cover 13 (FIG. 3(b)).

As shown in FIG. 5, when the base of the bonnet cover 14 is to be made of a metal, a so-called polyvinyl chloride resin metallic laminate is employed. The polyvinyl chloride resin metallic laminate (14a, 14c) is produced by laminating or coating the outside surface of aluminum, stainless steel, or plated steel plate (metallic material) 14C with a vinyl chloride resin layer 14a. The polyvinyl chloride resin metallic laminate (14a, 14c) is coated with a carbon coat layer 14b. The carbon coat 14b and the metallic material 14c are coupled to each other by applying a carbon coating 14d to at least one point e.g. four corners of the bonnet cover 14 (FIG. 5(b)).

The foregoing sandwich structure is employed for the following reasons: a carbon coating 13b, 14b deteriorates the surface DC electrical resistance, thereby decreasing the discharge current value and the discharge rate, and suppressing the development of an electromagnetic wave. A resin plate 13a (14a) acts as an insulator, and when a high-voltage discharge is induced in a carbon coat, the resin plate 13a (14a) hinders the discharge from reaching a metallic conductive coat 13c or a metallic material 14c, and when an aerial discharge develops an electromagnetic wave, the metallic component of the metallic conductive coat 13c or the metallic material 14c generates a magnetic field oriented in such a direction as to cancel out an eddy current occurring with the incoming magnetic field of the electromagnetic wave. Thereby, the magnetic field in an enclosure is mitigated and the metallic conductive coat 13c or metallic material 14c acts as an electromagnetic shield. A carbon coat 13b or 14b and a metallic conductive coat 13c or metallic material 14c are electrically coupled to each other at at least one point, e.g., at four corners of the bonnet cover 13, 14 so as to allow a discharge current and a charge to flow into the frame (as shown in FIGS. 7, 8, and 9 (ground paths 1 and 2)).

Figure 8:
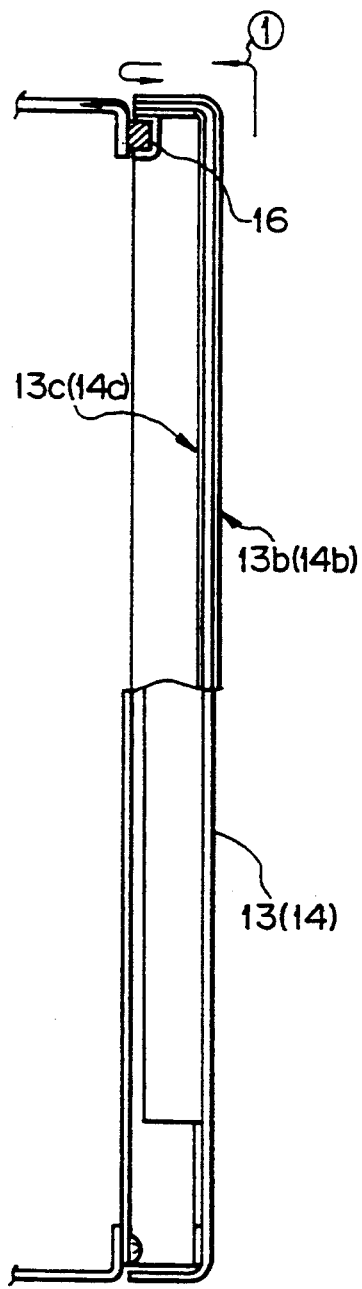
FIG. 8 is a view taken along line B—B of FIG. 7.
Figure 9:
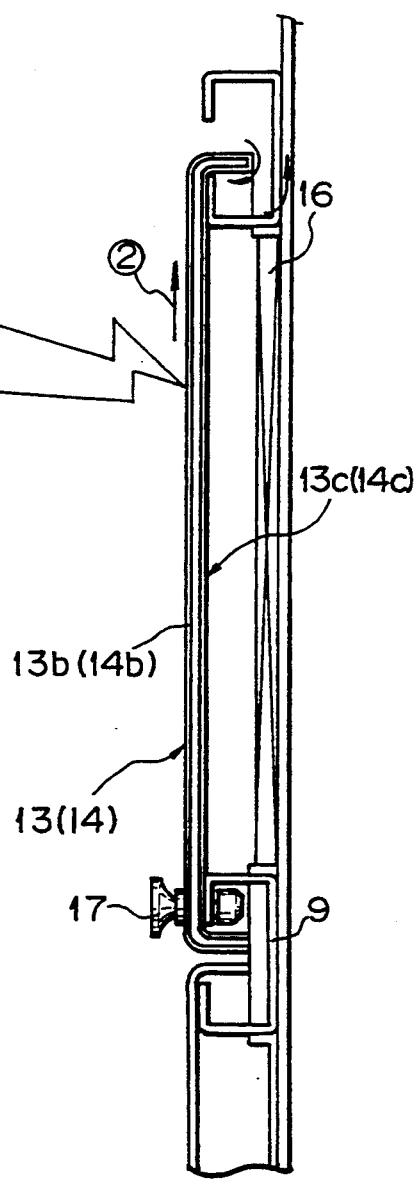
FIG. 9 is a view taken along line C—C of FIG. 7.

Bonnet covers 13, 14 have, as shown in FIGS. 8 and 9, EMI gaskets 16 on their inner side surfaces. The EMI gaskets 16 seal the joints between the bonnet covers 13, 14 and the frame. Each of the bonnet covers 13, 14 is attached to a clamp 9 using a resin fastener that has a high breakdown voltage and scarcely induces a discharge; such as, so-called Nylatch 17. A discharge is induced in a bare area of a metallic conductive coat 13c or a metallic material 14c to develop an electromagnetic wave. Therefore, when a metallic conductive coating 13c is applied, areas around Nylatch holes or vents must be masked (FIG. 4). When a metallic material 14c is adopted, the areas around Nylatch holes or vents must be coated with carbon coat 14b' (FIG. 6).

Figure 10:
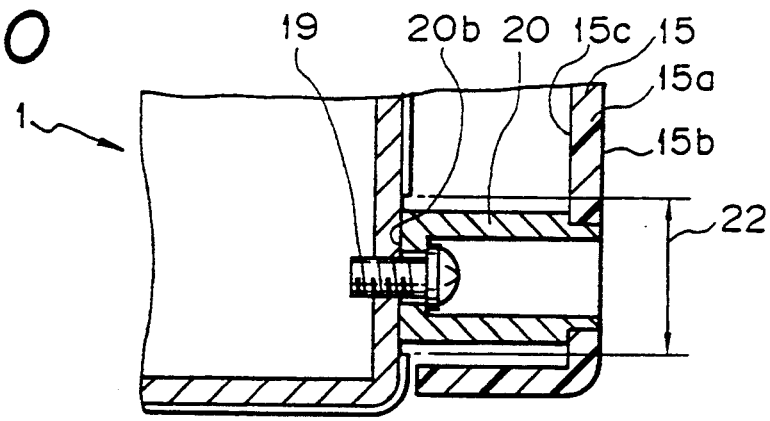
FIG. 10 is a view taken along line A—A of FIG. 1.

On the other hand, the base (15a) of the side cover 15 is, similar to that of the bonnet covers 13, formed with, for example, acrylic denatured high-impact vinyl chloride resin plates 15a. As shown in FIG. 10, the outside surface of the resin plate 15a is coated with carbon coat 15b. The areas (bushings 20) brought into contact with a frame 1 are coated with carbon coat 20b, and the portion or area 22 of the frame 1 brought into contact with the bushings 20 is uncoated or made of bare plated steel plate. However, when a framework 2 is not covered with plates 3 and 4, and since an electromagnetic shield is required, the inside of the side cover 15 must be coated with a metallic conductive material layer 15c. When the side cover 15 is mounted on the framework 2 using, for example, machine screws 19, recesses in which the heads of the machine screws 19 are hidden are made in advance so that the heads of the tightened machine screws will not extend beyond the surfaces of the side cover 15 (FIG. 10).

In a frame 1 of this embodiment having the aforesaid configuration, the resin bases 13a, 15a or resin layer 14a of covers 13, 14 and 15 improve the dielectric strengths of the covers, and when the resin bases 13a, 15a are employed, the metallic components of the metallic conductive coats 13c, 15c improve the shielding efficiencies of the covers. According to the results of ESD research, experiments have revealed that when only a metallic material is employed, a test for an electrostatic discharge withstand current rating results in an error of about 2 kV, and when a sandwich structure in which a resin is placed between a carbon coat and a metallic material is employed, the test for an electrostatic discharge withstand current rating does not cause an error with a voltage of less than 20 kV. Thus, the structure in this embodiment has proved to be advantageous.

In the first embodiment, covers 13, 14, 15 resistive to ESD and EMI are mounted on a framework 2 to structure a frame 1, and according to this compact frame structure, when covers are stylized and standardized in advance as shown in FIG. 11, even if a system is expanded, a frame accommodating the system can be easily constructed.

Figure 11A:
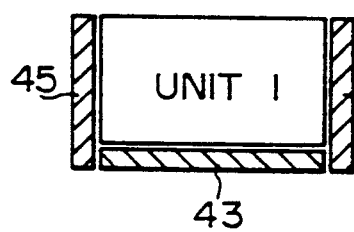
FIGS. 11(a) and 11(d) show examples of layouts of covers in a communication system according to the first embodiment of the present invention.
Figure 11B:
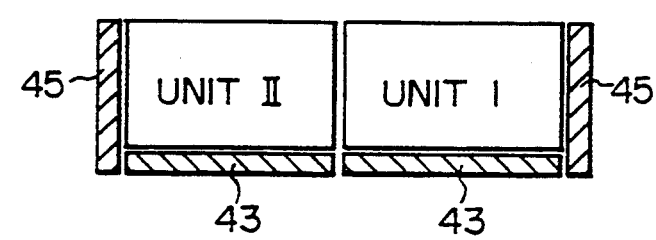

To be more specific, when a unit I and a unit II are arranged side by side (FIG. 11(b)) and covered, standard covers shown in FIG. 11(a) (bonnet covers 43 and side covers 45) are combined and easily constructed.

Figure 11C:
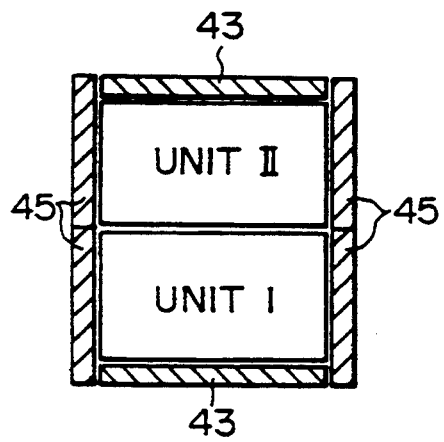

When the units I and II are arranged back to back and covered (FIG. 11(c)), the standard covers 43 and 45 shown in FIG. 11(a) are combined and constructed.

Figure 11D:
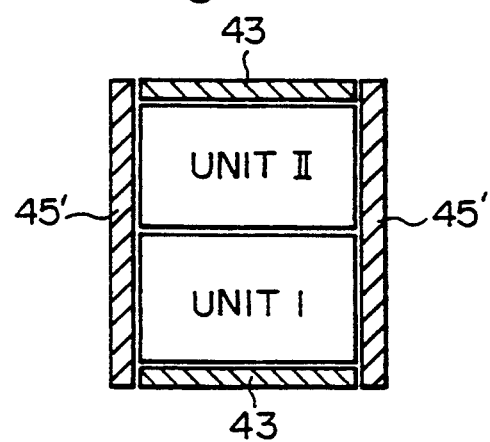

Alternatively, as shown in FIG. 11(D), large side covers 45' that are large enough to cover the sides of the units I and II may be prepared and combined with the standard covers 43 so as to enclose the entire system.

Figure 12:
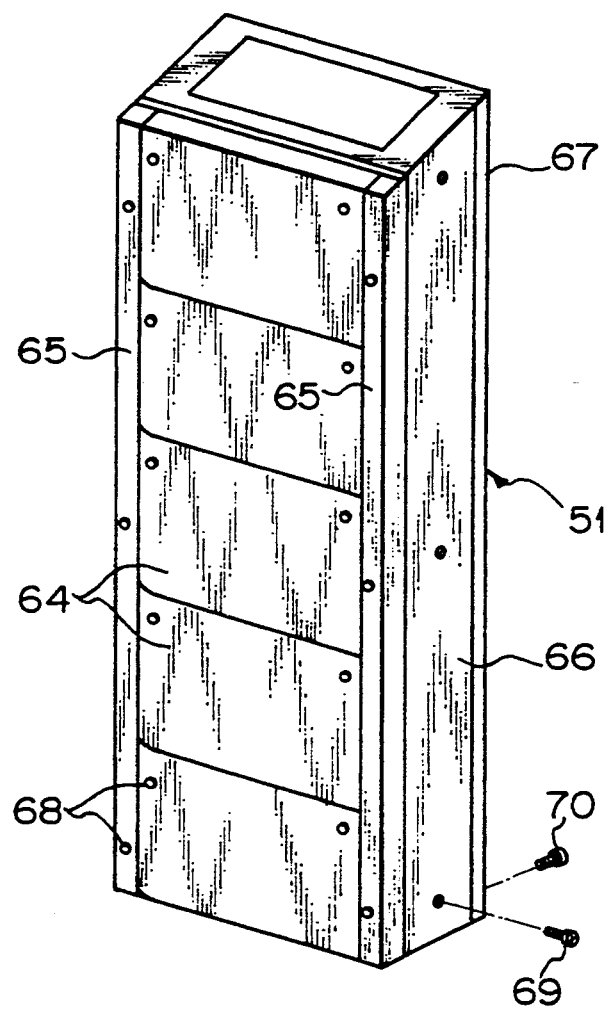
FIG. 12 is an overall oblique view of a frame for a communication system according to a second embodiment of the present invention.
Figure 13:
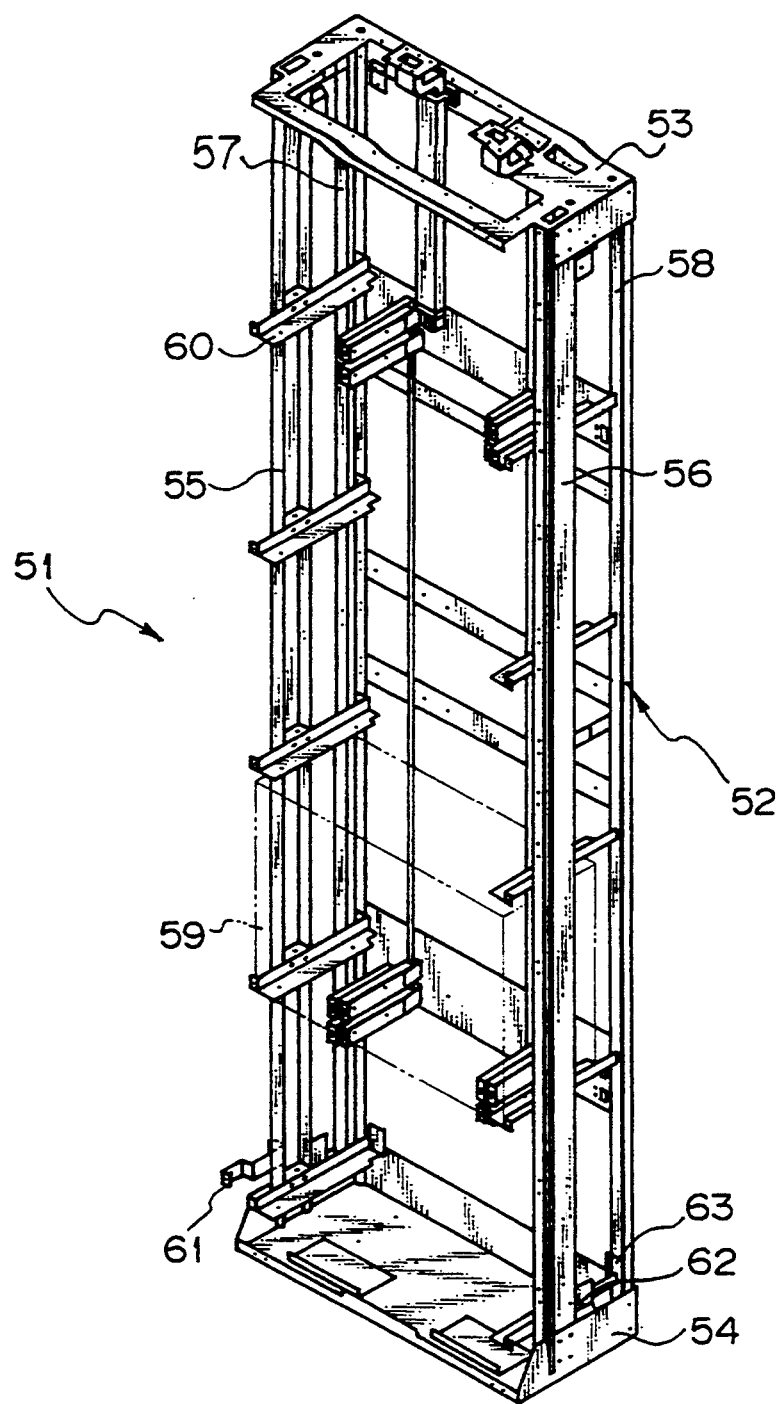
FIG. 13 is an oblique view of a frame with the front, side, and back covers removed according to the second embodiment of the present invention.

FIG. 12 is an overall oblique view of a frame for a communication system in a second embodiment of the present invention. FIG. 13 is an oblique view of the frame with the front, side, and back covers removed.

In FIGS. 12 and 13, a framework 52 of a frame 51 of the second embodiment comprises, in principle, top and bottom frames 53 and 54, and side columns 55, 56, 57, and 58.

In FIG. 13, 59 denotes a shelf accommodating communication equipment. Multiple shelves are mounted on the framework 52 (only one shelf is illustrated).

Pluralities of shelf mounting brackets 60 and cable duct clamps 61 are screwed on the opened front of the framework 52. A plurality of back cover clamps 63 are screwed on the back of the framework 52. Said clamps are plated to conduct electricity. On the thus-constituted front of the framework 52, pluralities of bonnet covers 64 and cable ducts 65 are mounted as shown in FIG. 12. Side covers 66 and a back cover 67 are mounted on the sides and back of the framework 52. Thus, a frame 51 of this embodiment is structured.

Figure 14A:
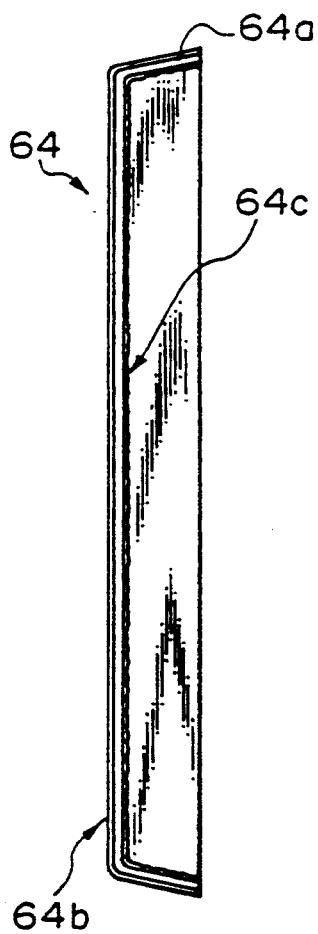
FIGS. 14(a) and 14(b) are views showing a bonnet cover having a resin base.
Figure 14B:
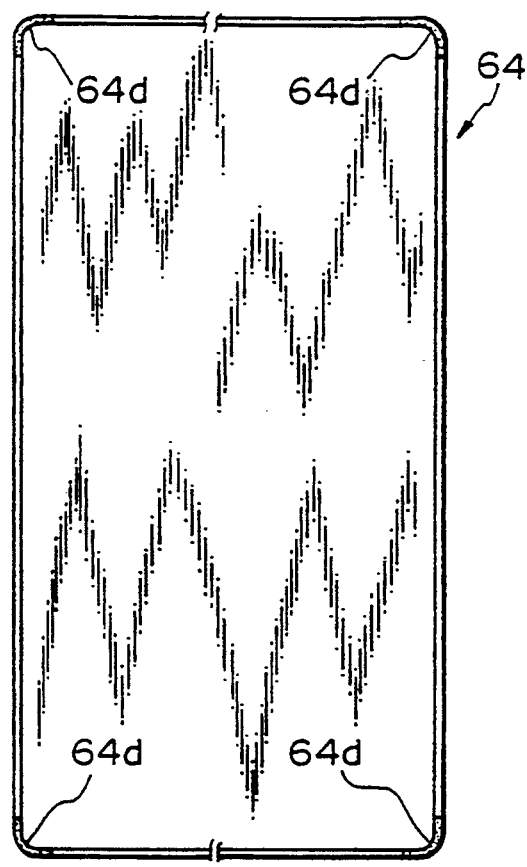

As shown in FIGS. 14(a) and (b), each of the bases of the bonnet covers 64 is formed with, for example, a plate (64a) that is made of an acrylic denatured high-impact vinyl chloride resin having excellent formability and mechanical characteristics and has one face coated with aluminum layer 64c [for example, Kaydux Emicon: Tsutsunaka Plastic Industries, Co., Ltd.]. Then, the other surface of the plate (64a) is coated with a carbon coating layer 64b. The metallic conductive coating 13c as performed in the first embodiment need not be done here because of the coated aluminum 64c. The carbon coat 64b and aluminum coat 64c are coupled to each other at one or more points 64d e.g. at four corners of the bonnet cover 64.

Figure 15:
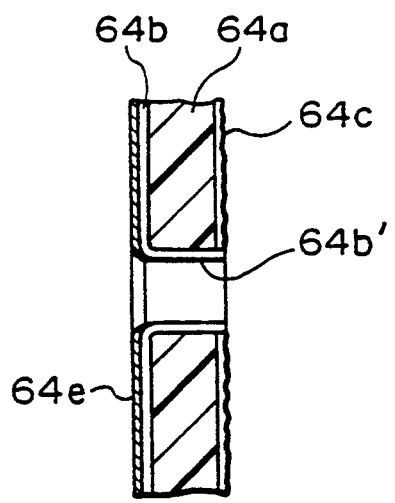
FIG. 15 is a cross-sectional diagram showing the vicinity of a hole on the bonnet cover shown in FIGS. 14(a) and 14(b)

The bonnet covers 64 have, similar to the bonnet covers in the first embodiment, EMI gaskets (not shown) on their inner side surfaces. The EMI gaskets seal the joints between the bonnet covers 64 and the shelves. Each of said bonnet covers 64 is attached to a bracket 60 using a resin fastener having a high breakdown voltage and scarcely inducing a discharge; such as, so-called Nylatch 68. An area of a bare metallic material induces a discharge so as to develop an electromagnetic wave. Therefore, as shown in FIG. 15, the inner surfaces of the ends of Nylatch holes or the vents should be coated with a carbon coat 64b'.

The cable ducts 65 may have the same composition as the bonnet covers 64, which are attached to clamps 61 with Nylatches 68. The cable ducts 65 have EMI gaskets to seal their joints with the frame.

The side covers 66 may have the same composition as the bonnet covers 64, which are attached to clamps 62. When the side covers 66 are mounted on the framework 52 using, for example, machine screws 69, recesses in which the heads of the machine screws 69 are hidden are made on the side covers 66 in advance so that the heads of the tightened machine screws 69 will not extend beyond the surfaces of the side covers 66.

The back cover 67 may have the same composition as the bonnet covers 64, which are attached to the clamps 63. When the back cover 67 is mounted on the framework 52 using, for example, machine screws 70, recesses in which the heads of the machine screws are hidden are made on the back cover 67 in advance so that the heads of the tightened machine screws 70 will not extend beyond the surface of the back cover 67.

In a frame 51 of this embodiment having the aforesaid configuration, the resin bases of covers 64 to 67 improve the dielectric strengths of the covers 64 to 67. Coated aluminum layer (64c) improves the shielding efficiencies of the covers 64, 65, 66, and 67.

The results of ESD research have verified that the embodiment has superb advantages similar to the first embodiment.

In the second embodiment, a frame 51 is constructed by mounting covers 64, 65, 66, and 67 resistive to ESD and EMI on a framework 52. According to this simple and compact frame structure, when covers are stylized and standardized in advance as shown in FIG. 16, even if a system is expanded, the system can be easily enclosed.

Figure 16A:
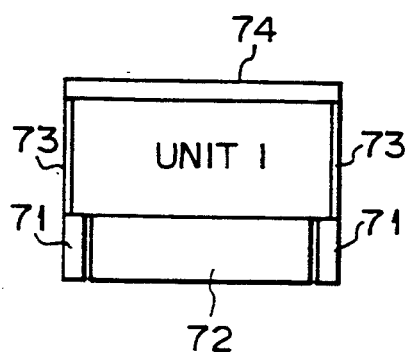
FIGS. 16(a)–16(d) show examples of layouts of covers in a communication system according to the second embodiment of the present invention.
Figure 16B:
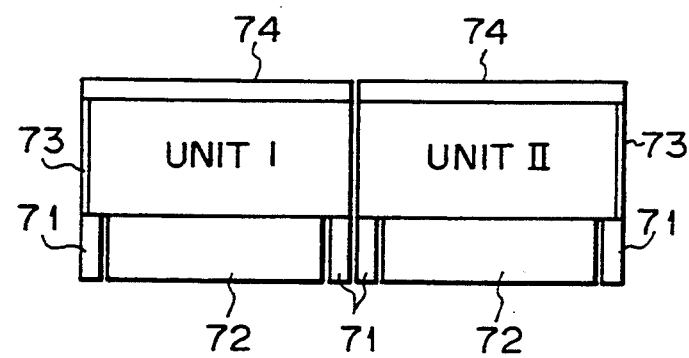

To be more specific, when a unit I and an unit II are arranged side by side and covered (FIG. 16(B)), standard covers (cable ducts 71, bonnet covers 72, side covers 73, and a back cover 74) shown in FIG. 16A are combined and easily constructed.

Figure 16C:
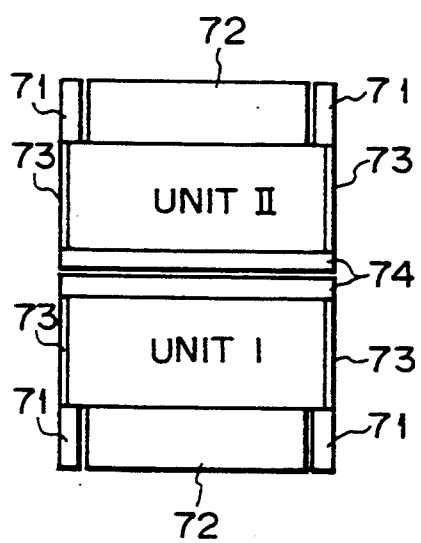

When the units I and II are arranged back to back and covered (FIG. 16(C)), the standard covers 71, 72, 73, and 74 shown in FIG. 16A are combined and constructed.

Figure 16D:
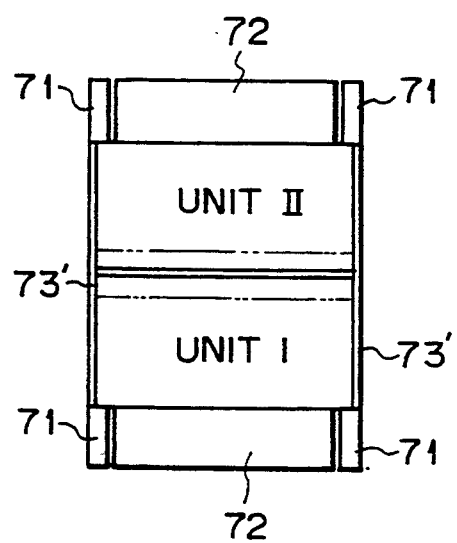

Alternatively, as shown in FIG. 16D, side covers 73' that are large enough to cover the sides of the units I and II at one time are prepared separately and combined with the standard covers 71 and 72 so as to enclose the entire system.

Figure 17:
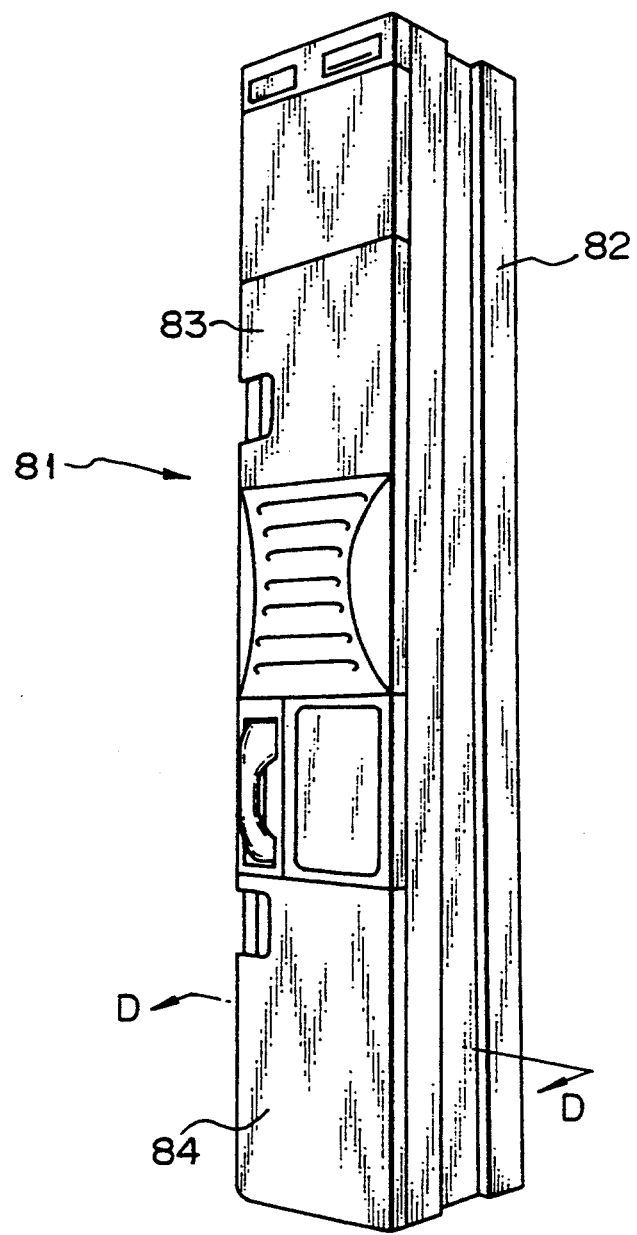
FIG. 17 is an overall oblique view of a frame for a communication system according to a third embodiment of the present invention.

FIG. 17 is an overall oblique view of a frame for a communication system in a third embodiment of the present invention. In FIG. 17, a frame 81 of this embodiment comprises, in principle, a box-like housing body 82 in which metallic cover members are mounted on all faces except part of the front of a framework holding a power unit, a transmitter, a receiver, and other multiple electronic units that constitute a communication system (not shown), and cover members (hereafter, cover doors) 83 and 84 mounted on part of the front of the framework so that they can be opened or closed.

Figure 18:
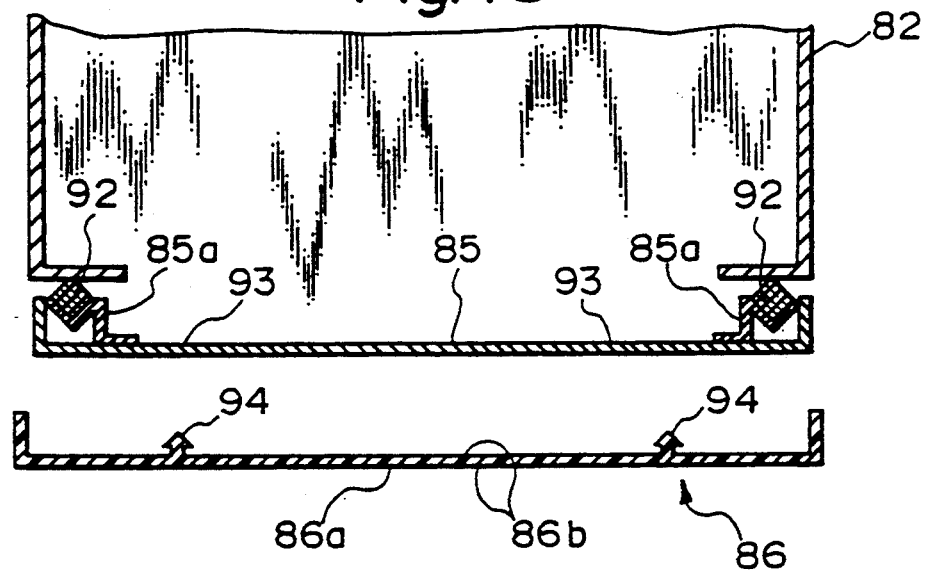
FIG. 18 shows a view taken along line D—D of FIG. 17.
Figure 19:
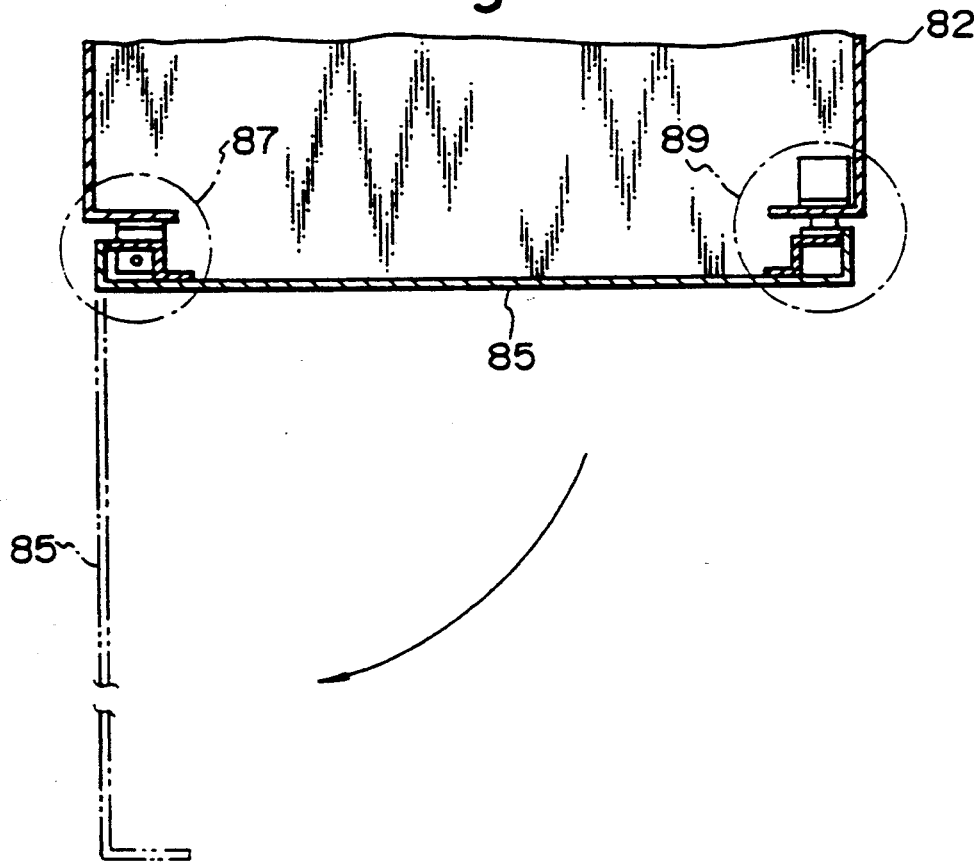
FIG. 19 is a cross-sectional diagram showing a structure for mounting an inner cover.
Figure 21:
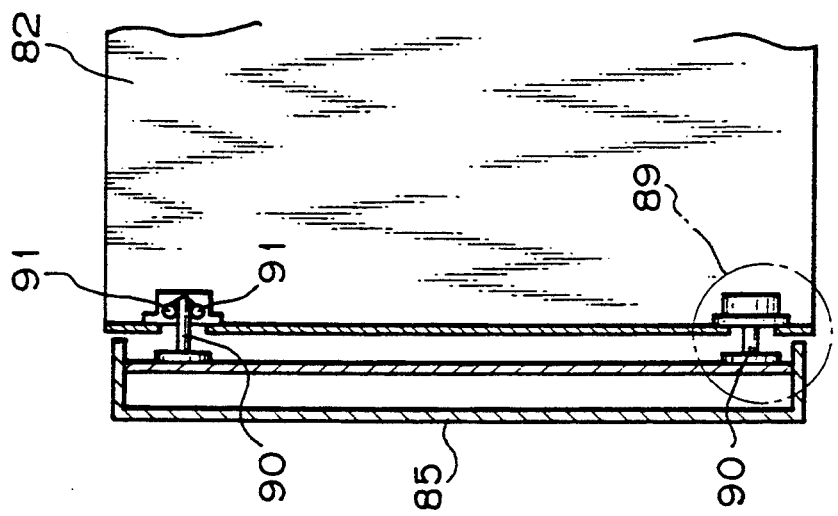
FIG. 21 is a cross-sectional diagram showing the configuration of a locking mechanism; and, FIG. 22 is a cross-sectional diagram showing another example of a cover door.
Figure 20:
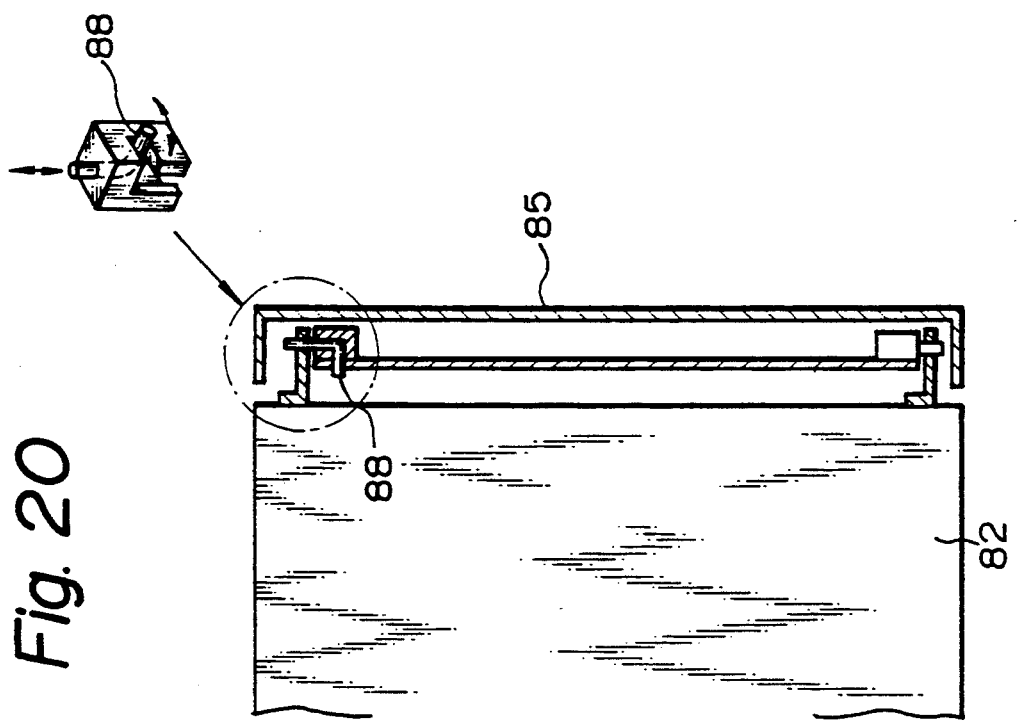
FIG. 20 is a cross-sectional diagram showing the configuration of a hinging mechanism.

Each of the cover doors 83 and 84 is, as shown in FIG. 18, made up of an inner cover 85 and an outer cover 86. The inner cover 85 is produced by bending a sheet metal that is made of a conducting metallic material as shown in FIGS. 18 to 21. A hinging mechanism 87 is formed to include an end of the inner cover 85 and the corresponding portion of the housing body 82. The hinging mechanism 87 attaches the inner cover 85 to the housing body 82 so that the inner cover can turn freely. The hinging mechanism is, as most clearly shown in FIG. 20, formed with a slide lever 88 that can be disengaged from a support hole on the housing body 82. Thereby, the inner cover 85 can be dismounted.

A locking mechanism 89 for locking the inner cover 85 in the housing body 82, in such a manner that the inner cover 85 can be released, is formed to include the other end of the inner cover and the corresponding portion of the housing body 82. The locking mechanism 89 is, as most clearly shown in FIG. 21, made up of multiple pins 90 projecting inward from the other end of the inner cover 85 and a pair of rollers 91 installed on the corresponding portion of the housing body 82. The tips of the pins 90 are slightly larger in diameter, and when the tips of the pins 90 are pressed into the paired rollers 91, the inner cover 85 is locked in the housing body 82, and when the inner cover 85 is turned, the tips of the pins 90 come out of the paired rollers 91, thereby releasing the lock.

As shown in FIG. 18, holders 85a are installed along the edges on the inner surface of the inner cover 85. Square shield packings 92 are attached to the holders 85a, which electromagnetically block the gaps between the inner cover 85 and housing body 82 when the inner cover 85 is closed, thereby improving the electromagnetic airtight seal in the frame, and holes 93 that are too small to affect the electromagnetic wave shielding efficiency of the frame are bored on the inner cover 85.

On the other hand, the outer cover 86 of the cover door 83 or 84 is formed with a plate 86a that is made of an acrylic denatured high-impact vinyl chloride resin having excellent formability and mechanical characteristics [TakiFlex EVC 8600: Takiron Co., Ltd.] and has its entire surface coated (including the edges) with the same carbon 86b as that described in the previous embodiment. The outer cover 86 is molded to a shape so as to cover the outer surface of the inner cover 85 entirely. On the inner surface of the outer cover 86, projections 94 are formed so as to engage with the holes 93 on the inner cover 85, and when the projections 94 are pressed into the holes 93, the outer cover 86 is mounted on the inner cover 85 in such a manner that the outer cover 86 can be dismounted from the inner cover 85.

When the cover door 83 or 84 is opened or closed, a person inevitably touches the cover door. The outer surface of the inner cover 85 is enclosed with the outer cover 86, and the outer cover 86 has the insulating resin surface coated with a semiconducting carbon; therefore, an electrostatic discharge hardly occurs. If an electrostatic discharge should occur, it is induced in the housing body 82 quickly, but the influence of the electrostatic discharge is negligible.

When opening the cover door 83 or 84, a person may touch the inner surface of the inner cover 85 or a metallic area of the housing body 82, but an electrostatic discharge does not occur, because static electricity, with which a human body is charged when opening or closing the inner cover 85, has already been discharged to the housing body 82 via a carbon-coated area; therefore, the system will not malfunction and the human body sustains no impact.

Figure 22:
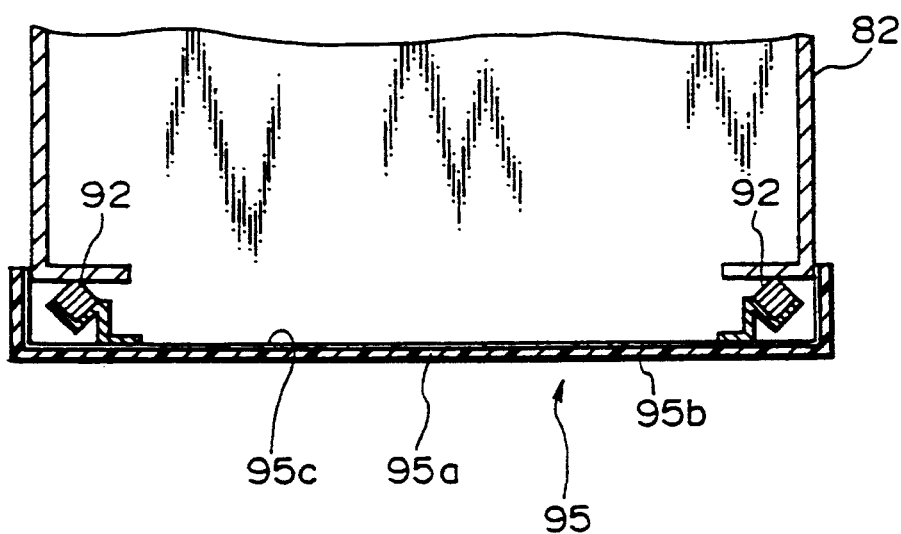

In this embodiment, each of the cover doors 83 and 84 is made up of an inner cover 85 and an outer cover 86. As shown in FIG. 22, the outer cover 86 may be abandoned. That is to say, the materials composing the inner cover are changed, and an acrylic denatured high-impact vinyl chloride resin plate 95a is used instead of a metal. Then, the surface (outer surface) of the plate 95a is coated with carbon 95b, and the back (inner surface) of the plate 95a is coated with a metallic conductive material 95c. And the produced cover door 95 may be adopted. This variant also provides the same advantages as the aforesaid embodiment and permits a simpler configuration.

From the foregoing, it can be seen that, the present invention has the advantages of effectively preventing the occurrence of a fault derived from electromagnetic interference (EMI) or an electrostatic discharge (ESD) and is capable of realizing a compact communication system. Thereby, the operability of the system is improved, the cost of the system is reduced, and the durability and reliability of the system are advanced. Unlike a conventional double structured frame, the frame according to the present invention is flexible enough to cope with changes in system configuration.

It is to be understood that the invention is by no means limited to the specific embodiments illustrated and described herein, and that various modifications thereof may be made which come within the scope of the present invention as defined in the appended claims.

We claim:

1. A frame structure for a communication system comprising:
   a framework for accommodating a communication system; and
   a cover member mounted on said framework, said cover member comprising an insulating material layer provided between a semiconducting material layer and a conducting material layer, said cover member being mounted on said framework so that said conducting material layer faces the inside of said structure, said semiconductor material layer and said conducting material layer being electrically connected to each other.

2. A frame structure for a communication system according to claim 1, wherein said insulating material layer is comprised of an insulating resin material, said semiconducting material layer is comprised of insulating material and a carbon material, and said conducting material layer is comprised of a conducting metallic coating.

3. A frame structure for a communication system according to claim 1, wherein said insulating material layer is comprised of an insulating resin material, said semiconducting material layer is comprised of an insulating material and a carbon material, and said conducting material layer is comprised of a conducting metal film.

4. A frame structure for a communication system according to claim 1, wherein said conducting material layer is comprised of a conducting metal material, said semiconducting material layer is comprised of insulating material and a carbon material, and said insulating material layer is comprised of an insulating resin material.

5. A frame structure for a communication system according to claim 1, wherein said cover member has at least one through hole provided therein, said through hole having an inner surface coated with a semiconducting material layer.

* * * * *

UNITED STATES PATENT AND TRADEMARK OFFICE
CERTIFICATE OF CORRECTION

PATENT NO. : 5,406,026
DATED : April 11, 1995
INVENTOR(S) : YAMAGUCHI et al.

It is certified that error appears in the above-indentified patent and that said Letters Patent is hereby corrected as shown below:

Col. 2, line 12, after "layouts" insert --and therefore--;
line 44, change "faces" to --face--.

Col. 4, line 24, change "11(a) and 11(d)" to --11(a)—11(d)--.

Signed and Sealed this

Thirty-first Day of October 1995

Attest:

BRUCE LEHMAN

Attesting Officer          Commissioner of Patents and Trademarks